United States Patent [19]

Appel et al.

[11] Patent Number: 5,600,126

[45] Date of Patent: Feb. 4, 1997

[54] METHOD AND APPARATUS FOR CONTROLLING THE POWER OUTPUT OF MULTIPLE LASER DIODES

[75] Inventors: James J. Appel, Rochester; Aron Nacman, Penfield, both of N.Y.

[73] Assignee: Xerox Corporation, Stamford, Conn.

[21] Appl. No.: 493,182

[22] Filed: Jun. 20, 1995

[51] Int. Cl.⁶ ..................................................... G01J 1/32
[52] U.S. Cl. .............................. 250/205; 250/206; 372/38
[58] Field of Search .................................. 250/205, 206; 372/38, 31, 29, 32

[56] References Cited

U.S. PATENT DOCUMENTS

| | | | |
|---|---|---|---|
| 4,625,315 | 11/1986 | Lemberger et al. | 372/38 |
| 4,796,964 | 1/1989 | Connell et al. | 359/218 |
| 5,019,769 | 5/1991 | Levinson | 372/29 |
| 5,311,005 | 5/1994 | Visocchi | 250/205 |

Primary Examiner—Que Le

[57] ABSTRACT

The present invention presents an apparatus and method for efficiently and automatically monitoring and adjusting the power output of laser diodes used to provide the scanning beams in a ROS system. Light radiated from the back facet of the laser diode is directed onto at least a pair of back facet photodiodes. The photodiode outputs are proportional to the power output of the laser diode associated with the photodiode. The polarization of the laser diode back facet output is controlled so as to ensure that the only outputs from an associated laser diode is sensed by an associated photodiode. In one embodiment, a half wave plate is used to rotate the polarization of one of the laser diodes and in another embodiment optical fibers efficiently transmit light emitted from the back facets to the photodiode.

9 Claims, 5 Drawing Sheets

METHOD AND APPARATUS FOR CONTROLLING THE POWER OUTPUT OF MULTIPLE LASER DIODES

BACKGROUND AND DISCLOSURE STATEMENT

The present invention relates generally to the monitoring of output power of a semiconductor laser diode and, particularly, to the monitoring of the output power of a laser diode by detecting radiation emitted from the laser diode back facet.

It is well known in the scanning art to use laser diodes to generate a coherent laser beam which is optically shaped and used to scan a recording medium surface. It is also known to use multiple laser diodes to create multiple beams, each individual beam independently modulated by video signals, and the multiple beams scanned onto the recording surface as modulated beams. For these multiple beam applications, it has been found advantageous to use arrays of closely spaced laser diodes. Closely spaced diodes allow for multiple beam processing and thus improve data throughput as compared with systems that employ continuous wave, single beam gas or laser diodes.

Typically, the laser diodes in a multiple beam system are individually addressable. Individual addressability generally requires that each diode have a separate current source that drives or modulates the diode. In operation, each driver sends a current through the diode sufficient to induce emission of laser light. The amount of current the driver produces is determined, in part, by the digital input data driving that particular lasing element. An example of a Raster Output Scan (ROS) system using a dual laser diode is disclosed in U.S. Pat. No. 4,796,964, whose contents are hereby incorporated by reference.

Because different laser diodes have different output power characteristics in response to a given driving current, it is desirable to monitor the amount of output power from each laser diode. If it is found that a particular diode is outputting too much or too little power at a given current level then the current needs to be adjusted to correct for the power differential. Laser diodes are typically constructed layer by layer from epitaxial deposition of appropriately doped semiconductor material. The front and back facets are then cleaved to produce reflective surfaces that define the front and back boundaries of the laser cavity. The front facet is designed to be much more transmissive than the back facet, the back facet generally made to be highly reflective. The majority of laser light is emitted from the front facet.

As stated above, the back facet is designed to be a highly reflective surface. However, some light does ultimately escape through the back facet of the diode. The amount of light leakage through the back facet is generally known to be directly proportional to the amount of light emitted from the front facet. This relationship between radiation from the back facet and the radiation from the front facet affords the opportunity to monitor the amount of output power from the front facet by detecting light emitted from the back facet.

To measure the amount of light from the back facet of a laser diode, a detector is typically disposed opposite the back facet of a single laser diode. In the case of a single laser diode configuration, one back facet detector gives complete information concerning the amount of radiation emanating from the front facet of that diode. In a multi-diode configuration, the confluence of concurrent, multiple beams on a single back facet detector does not give information concerning any particular diode and various measures must be taken to extract appropriate signals.

Figure 1:
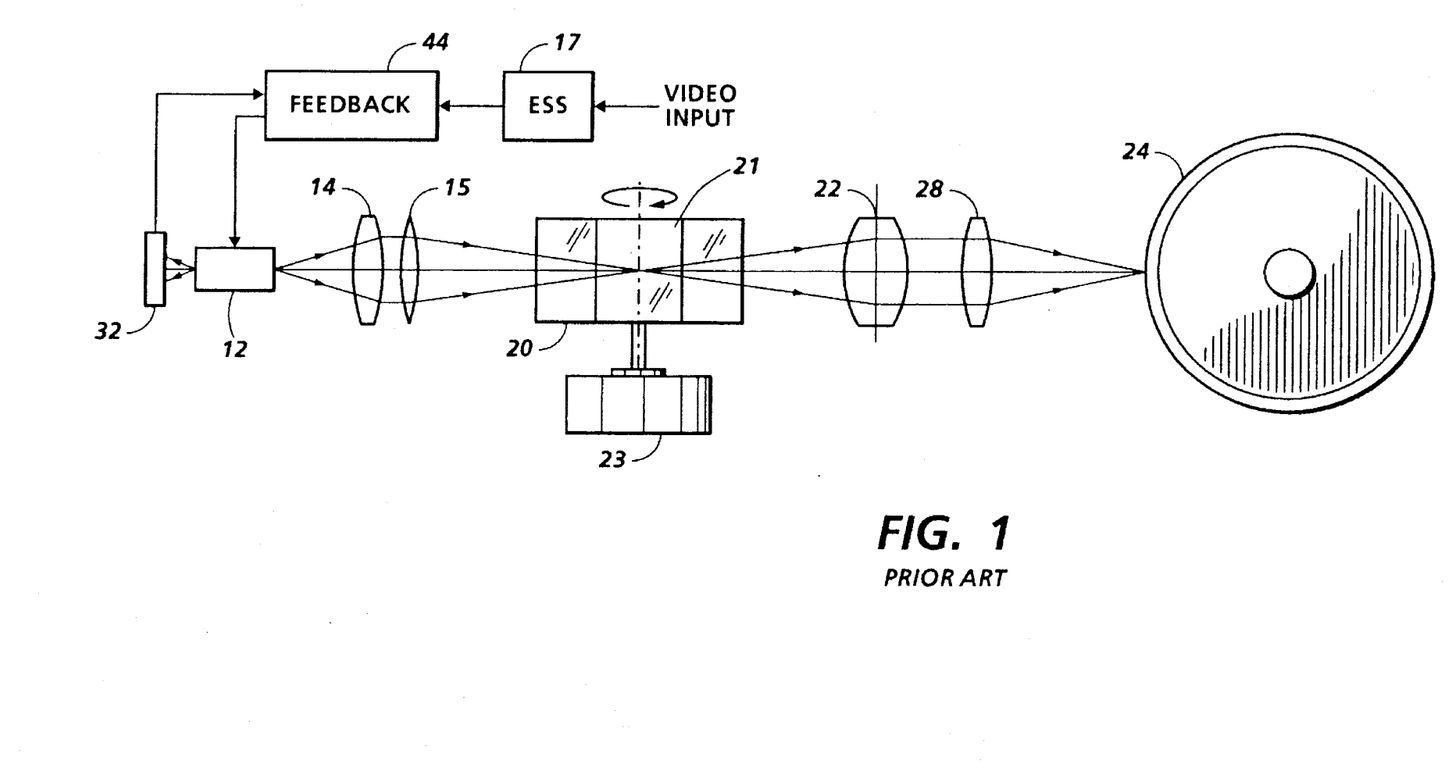
FIG. 1 is a side view of a prior art single beam ROS scanning system showing back facet power monitoring.

FIG. 1 shows a side schematic view of a prior art ROS system utilizing back facet detection feedback for controlling the diode output. Input video data is transmitted to a self-modulating light source 12, such as a low powered solid state laser diode, which produces a modulated diverging beam of coherent light. The diode is driven in accordance with image signals entered into and processed by ESS 17. The beam is collimated by a spherical collimating lens 14 and is next incident upon a cylindrical lens 15 which focuses the light to a line image in the fast scan direction onto a rotating polygon 20 having at least one mirrored facet 21. The rotation of the mirrored facets causes the beam to be deflected and thereby scanned across a photosensitive image member which is shown as a photoreceptor drum 24. Postscan optics system 22 reconfigures the beam reflected by facet 21 to a circular or elliptical cross-section, refocuses the beam to the proper point on the surface of drum 24, and corrects for scan nonlinearity (f-theta correction). A 1× (or other working magnification) toroidal lens 28 or cylinder mirror (not shown) is disposed between the scanning device 20 and the photoreceptor 24 to correct for wobble (scanner motion or facet errors) where appropriate.

The laser diode 12 has front and back facets. While the majority of the laser light escapes from the front facet, some radiation is emitted from the back facet of the diode. This radiation is detected by a photodiode 32 which generates output signals which are sent into feedback circuit 44. This signal is compared to a predetermined voltage level corresponding to the desired power output of the laser diode. If correction is needed, a signal is sent to the laser diode drive circuit to increase or reduce the emitter power output.

The problem with this prior art laser diode output monitoring system is that, for optimum light output control, real time, pixel by pixel control of a laser diode is needed to eliminate exposure variations along the scan line due to thermal effects in the laser diode such as droop, creep, and changes in the bias level and the slope of the LI curve. This type of light output control is difficult to implement because of the extremely short pixel times involved (typically, on the order of tens of nanoseconds.) In order to make the control system fast, the response time of the detection and feedback system must be minimized. In the present system of FIG. 1, there are two factors which can slow the response time of the detection system; one factor is driven by the electronics and the other is dependent on optical considerations.

The electronic factor involves the back facet photodiode circuit design. There are two design considerations which determine the response time of a photo diode circuit. First, the photodiode must be reverse-biased with the amount of biasing being proportional to a decrease in response time. The other design consideration for response time is the capacitance of the photo diode. The higher the capacitance, the higher the response time (low bandwidth). To design a fast photodiode circuit, it is necessary to limit the effect of the photodiode capacitance on the circuit. In a typical dual laser diode configuration, the cathode of the back facet photodiode is connected to ground, as well as to the laser diode case (for heat sinking), and the laser diode is driven with a positive current. The common connection to ground in this design configuration makes it impossible to reverse bias the back facet photodiode with a negative voltage at its anode and measure the current directly out of its cathode. Since both the anode and the cathode are connected to a voltage, it is impossible to directly measure the current out of the back facet photo diode. The only way to measure the photo diode current (monitor) is to indirectly measure the voltage across a dropping resistor (r1). The response time of this circuit is limited to the photo diode capacitance times the resistor (r1) value (RC time constant). Since the photodiode puts out a relatively small current the value of r1 needs to be relatively large to produce a usable signal. The RC time constant of this circuit severely limits the bandwidth of this circuit.

The optical factor which slows the response time involves the size of the back facet photodiode 32, which is proportional to its capacitance. The larger the photo diode the larger the capacitance. The back facet detector in a typical laser diode package configuration is inherently slow because it is relatively large, on the order of 0.64 mm$^2$. The size of one commercial detector, a Motorola MRD500 which has a fast response is 0.025 mm$^2$. A larger back facet detector is used, in the conventional laser diode package configuration, because it is positioned approximately 2 mm from the back facet of the laser diode, and must therefore be large to collect sufficient light from the back facet emission to produce an adequate signal to noise ratio at the output from the back facet detector.

The above problems are compounded in a laser diode system having two or more laser emitter outputs. The output from one of the laser diodes must be monitored while the other laser diode is being modulated. Thus, the light output by a first diode must be detected independent of the light output by the second diode. In currently available dual laser diode packages, a single photodiode is used to monitor both laser diodes. This configuration makes real time control impossible. It is apparent that it would be more efficient to be able to separately and simultaneously measure the light intensity of each laser diode emitter.

Thus, there is a need to construct an array architecture such that the amount of light emitted from individual back facets, of a multiple laser diode configuration is detected by corresponding photodiodes. Additionally, there is a need to regulate the output of the individual diodes in a continuous closed loop configuration to insure high print quality.

It is thus a first object of the present invention to provide a back facet monitoring system such that the amount of output power from individual back facets of laser diodes can be individually monitored in a continuous fashion with a relatively fast response time.

There are additional prior art problems in back facet monitoring. In typical laser designs, the back facet is coated with a reflective material with 99.5% reflectivity. Thus only a small amount of light (0.5%) is emitted from the back facet and is available to measure the power. Thus, photodiode 32 in FIG. 1, which is typically placed several millimeters behind laser 12, collects only a relatively small fraction of the already reduced light emitted from the laser 12 back facet.

It is therefore a second object of the present invention to increase the sensitivity of the back facet light detector.

Another problem of prior art systems is stray light impinging on the photodiode 32 distorting the output signal. The stray light is the result of reflections from the optical components in the system (e.g., from the optical components in lens 24) being reflected from the rear facet and onto the detector. The detected signal will be distorted due to the optically induced "noise". For multiple diodes, increased "cross talk" results.

It is therefore a still further object of the invention to reduce the effects of stray light interference on back facet power monitoring detector signals. These and other objects are realized by replacing the single prior art large sized back facet photodiode with two smaller photodiodes which are mounted relatively close to the back facets of the laser diodes being monitored. In one embodiment, each photodiode has orthogonally oriented polarizers formed over the detecting face to shield each photodiode from the back facet light emitted by the laser diode it does not monitor. An improved optical feedback circuit is used to control each laser diode output power and bias level in response to the signals detected by the respective photodiode. In another embodiment, in addition to the orthogonally oriented polarizers over each photodiode a polarization rotating half wave plate is positioned between one of the diodes and its corresponding photodiode enabling a simplified control circuit and relaxing the specification and crosstalk between the two laser diodes. More particularly, the present invention relates to an apparatus for monitoring the power output of at least a first and second laser diode each having at least a front and back facet, said laser diode generating output beams having different polarization characteristics, said apparatus including:

at least a first and second photodiode associated with said first and second laser diodes, said photodiode positioned so as to receive at least a portion of the light emitted from the back facets of said laser diodes;

means for selectively changing the polarization of at least one of said output beams whereby the light output from back facets are selectively sensed by said photodiodes; and means for monitoring the output of said photodiodes and for adjusting the power outputs of said laser diodes to maintain the desired level.

DESCRIPTION OF THE INVENTION

The following description is presented to enable any person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

Figure 2:
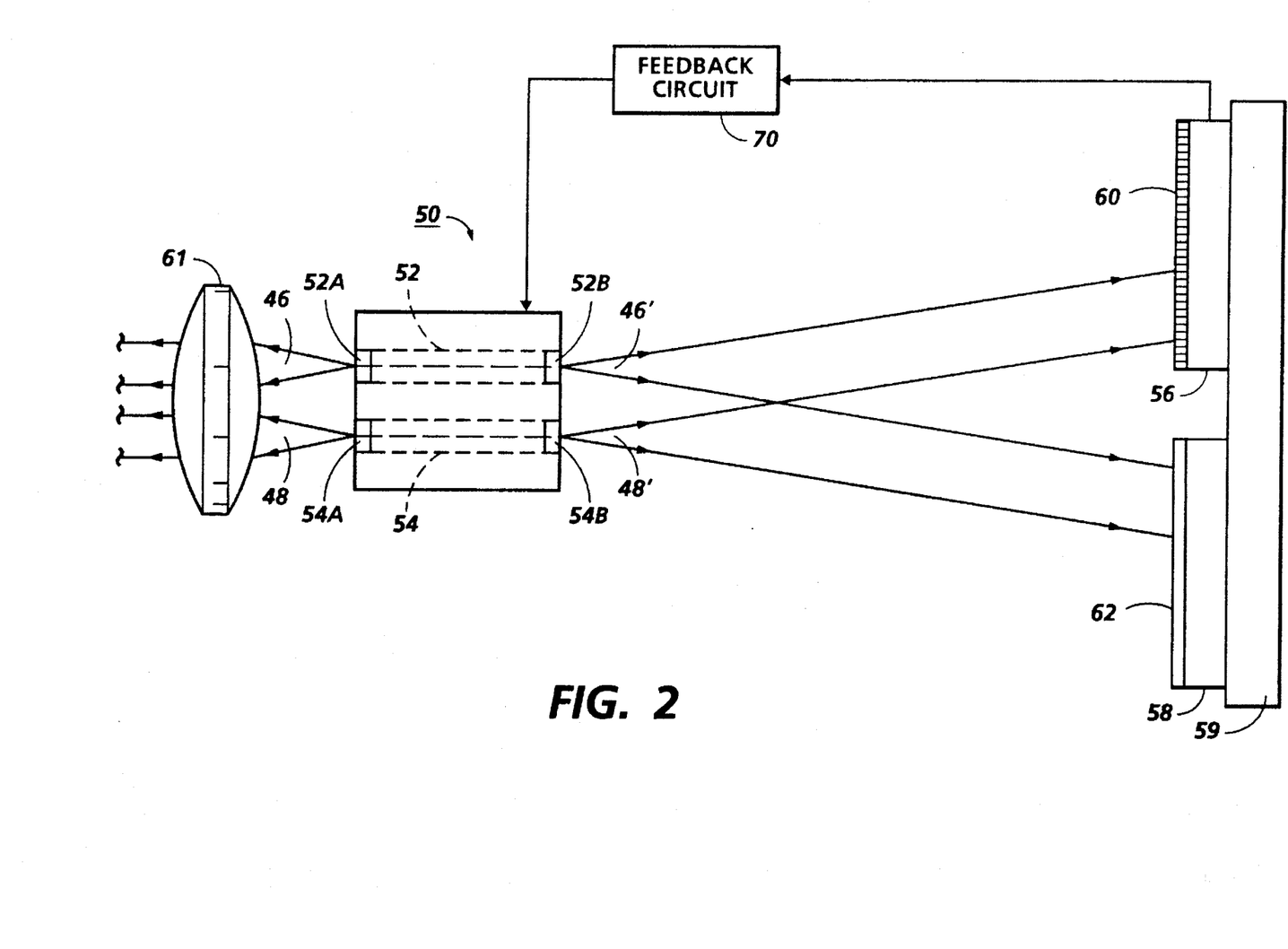
FIG. 2 shows a top view of one embodiment of the invention which includes two back facet diodes constructed with orthogonally oriented polarizers covering their detecting surface.

Referring to FIG. 2, a side view of one embodiment of the present invention having two laser diodes as shown. An array 50 is comprised of laser diodes 52, 54. Array 50 can be used to provide beams, beams 46, 48 which are collimated by collimator lens 61 and used for beam scanning purposes in a ROS system of the type disclosed, for example, in U.S. Pat. No. 4,796,964. Diode 52 has a front facet 52A and back facet 52B; diode 54 has a front facet 54A and a back facet 54B. The light emitted from back facets 52B, 54B, beams 46', 48', respectively, is incident onto photodiodes 56, 58, respectively, formed on a linear array 59.

The two photodiodes 56, 58, in a preferred embodiment, are similar in size and response time to the Motorola MRD500 detector, (0.025 mm$^2$) in the laser diode package and are positioned within 0.6 mm of the back facets of the laser diodes. With the photodiodes this close to the back facets they will capture light out to the full width half max (FWHM) in the small divergence angle direction, which is in the plane of the page; e.g., about 76% of the light will be captured. These laser diodes can be fabricated with output beams either polarized in the plane of the page or perpendicular to the plane of the page. The output of laser diode 52 is polarized in the plane of the page and laser diode 54 is polarized perpendicular to the plane of the page. Polarizers 60, 62 are positioned over each of the photodiodes 56, 58. Polarizer 60 over photodiode 56 has its axis of transmission parallel to the direction of polarization of the beam emitted from laser diode 52. The polarizer 62 over photodiode 58 has its axis of transmission parallel to the direction of polarization of the beam emitted from the laser diode 54. This configuration prevents the beam from laser diode 52 from reaching photodiode 58 and the beam from laser diode 54 from reaching photodiode 56, 58. The configuration will work with monolithic dual diodes, as shown, and also with hybrid dual diode pairs which are orthogonally polarized.

Figure 3:
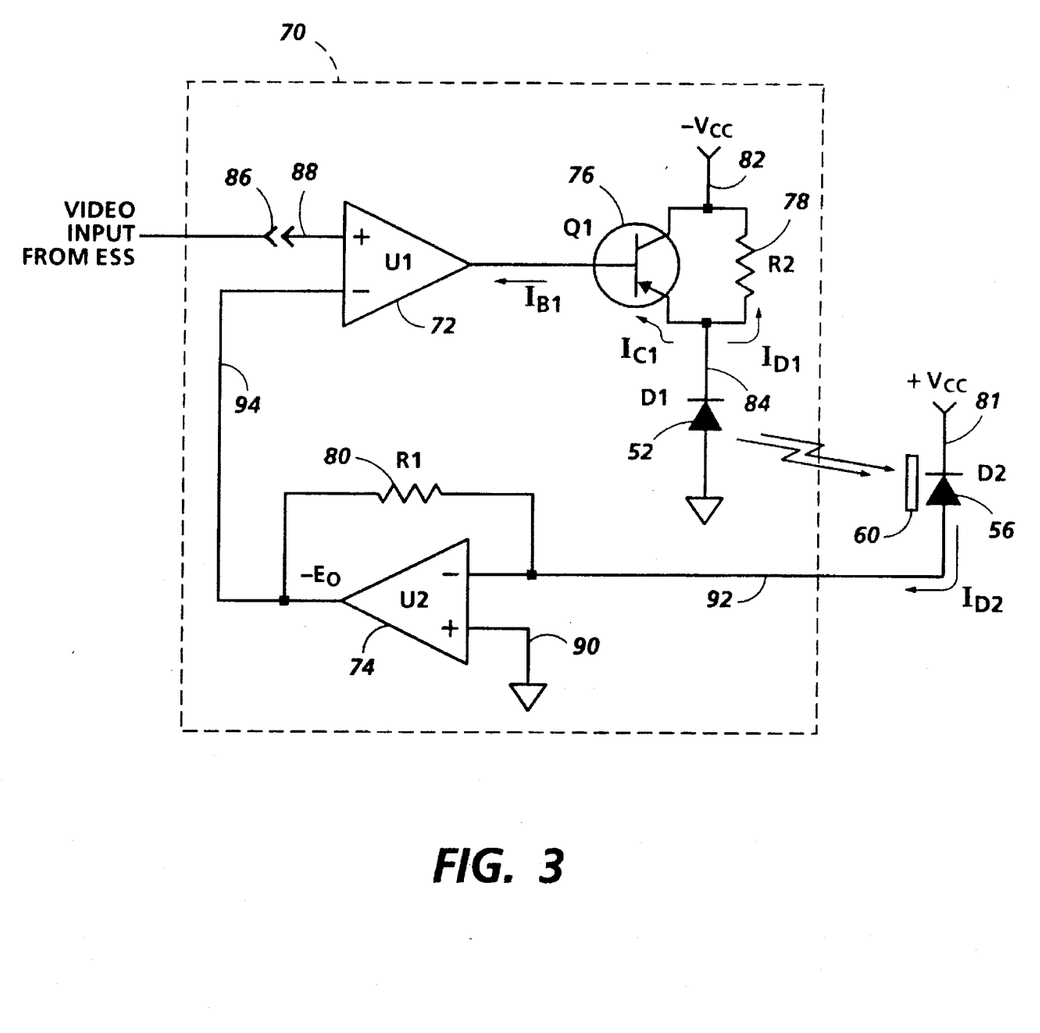
FIG. 3 is a feedback circuit for the FIG. 2 embodiment.

Each back facet photodiode 56, 58 is reversed biased with the cathode at a positive voltage (+$V_{CC}$), and the feedback circuit 70, shown in detail in FIG. 3, is built into the laser diode package configuration. FIG. 3 shows only the feedback circuit for laser diode 52 but diode 54 has the same feedback circuit. The circuit shown uses optical feedback and two operational amplifiers to force the light output of the laser diode to be constant in response to an input voltage. Circuit 70 comprises operational amplifiers 72, 74, transistor 76, resistors 78, 80. Reverse bias is applied to photodiode 56 with a positive DC voltage supply +$V_{CC}$ connected by conductor 81 to the cathode of photodiode 56. A negative DC voltage supply −$V_{CC}$ is connected by conductor 82 to the collector of a p-n-p transistor 76 and laser diode bias resistor 78. DC voltage supply −$V_{CC}$ applies a forward bias to the cathode of laser diode 52 through resistor 78 and transistor 76 when 76 is active. The emitter of transistor 76 and bias resistor 78 are connected to the cathode of laser diode 52 by conductor 84. The value of bias resistor 78 is selected to establish a small amount of forward diode current $I_{D1}$ which flows through laser diode 52. Bias resistor 78 is selected so that Id1 is below the knee of the laser diode forward bias curve for worst case of all conditions (temperature, age, specification variance).

A video input from the ESS, composed of a plurality of negative polarity pluses, is coupled via connector 86 and conductor 88 to the non-inverting input (+) of operational amplifier 72. The amplitude of this signal controls the light output of laser diode 52. The single-ended output of operational amplifier 72 provides a forward bias between the base and emitter of transistor 76. A sufficient amount of base current $I_{B1}$, causes transistor 76 to conduct current from emitter to collector as a function of its current gain. When transistor 76 is turned off, the amount of forward current flowing through laser diode 52 is equal to $I_{D1}$. Because some light will be received by back facet photodiode 56 in response to Id1, amplifier 74 will place a negative voltage at the inverting input of amplifier 72. The output of amplifier 72 will go to the positive rail because it can't turn the laser diode off any further since current Id1 is not in control of transistor 76. In order to have amplifier 72 operate with a high bandwidth, it needs to be selected such that it can operate at a positive rail of ground (0 volts). As video input signals arrive at the non-inverting input (+) of amplifier 72, the voltage potential at the base of transistor 76 goes negative so that current $I_{B1}$ flows out of the base. Transistor 76 is turned on whereupon current $I_{C1}$ flows from the emitter of transistor 76, upward through the base region, and then out of the collector. When transistor 76 is turned on, the amount forward current flowing through laser diode 52 is equal to the sum of $I_{C1}$ and $I_{D1}$ to produce an "on-state" drive current in laser diode 56. Laser diode 52 emits light in response to the "on-state" drive current. The photodiode 56 receives the light and correspondingly generates a positive current at its anode.

Turning now to operational amplifier 74, operational amplifier 74 serves to isolate the capacitance of photodiode 56 from resistor 80. The non-inverting input (+) is grounded via conductor 90. An input signal $I_{D2}$ is applied from photodiode 56, by conductor 92, to the inverting input (−) of operational amplifier 74. Feedback around the operational amplifier is between the single-ended output and the non-inverting input (+) via resistor 80. Resistor 80 converts the current $I_{D2}$ received from photodiode 56 to a negative output voltage −$E_O$, where $E_O = -(Id2 \times R1)$. R1 needs to be selected so that −$E_O$ will have the correct value for the corresponding laser light output intensity given that Id2 will have have a value determined by it's semiconductor properties, the amount of back bias applied, and the amount of laser light it receives. The negative output voltage −$E_O$ is applied to the inverting input (−) of operational amplifier 72 via conductor 94.

In order to drive the laser diode 52 at high speeds, operational amplifier 72 forces the differential voltage between its non-inverting (+) and inverting (−) inputs to 0 volts. This is accomplished by sourcing an appropriate amount of current through laser diode 52. If the emitted light from laser diode 52 changes for any reason other than a level change in the video input signal, operational amplifier 72 compensates by changing the drive current through laser diode 56 so as to maintain the voltage at its inverting (−) input equal to the video input voltage present at its non-inverting (+) input.

In the proposed circuit, the cathode of the photodiode is not connected to the laser diode anode. The photodiode can be reverse-biased with a positive voltage applied at its cathode. The current flowing out of the photodiode anode can be directly measured with an operational amplifier that isolates the diode capacitance from the dropping resistor ($R_1$). The operational amplifier provides the driving current through $R_1$ in response to the photodetector current. The response time of this circuit is limited by the slew rate of the operational amplifier. The bandwidth of the proposed circuit is dependent on several factors: the slew rate and stability the operational amplifiers, the rise time of the back facet photodetector (which is directly affected by the magnitude of the reverse voltage bias); and the sensitivity (amperes/watt) of the back facet photodetector.

This arrangement collects an appreciable fraction of the light from the back facet of each laser. By collecting an appreciable fraction of the light emitted by each laser (76% of the light emitted from back facets 52B, 54B), the maximum sensitivity of each sensor is realized. Since each back facet output is collected by a separate photosensor, the output of each diode can be detected independent of the other.

Thus, each photodiode 56, 58 generates an output signal which is proportional to the power output of diodes 52, 54, respectively. Orthogonally created polarizers prevent stray light from being detected with the back facet light emitted from the laser diodes.

Figure 4:
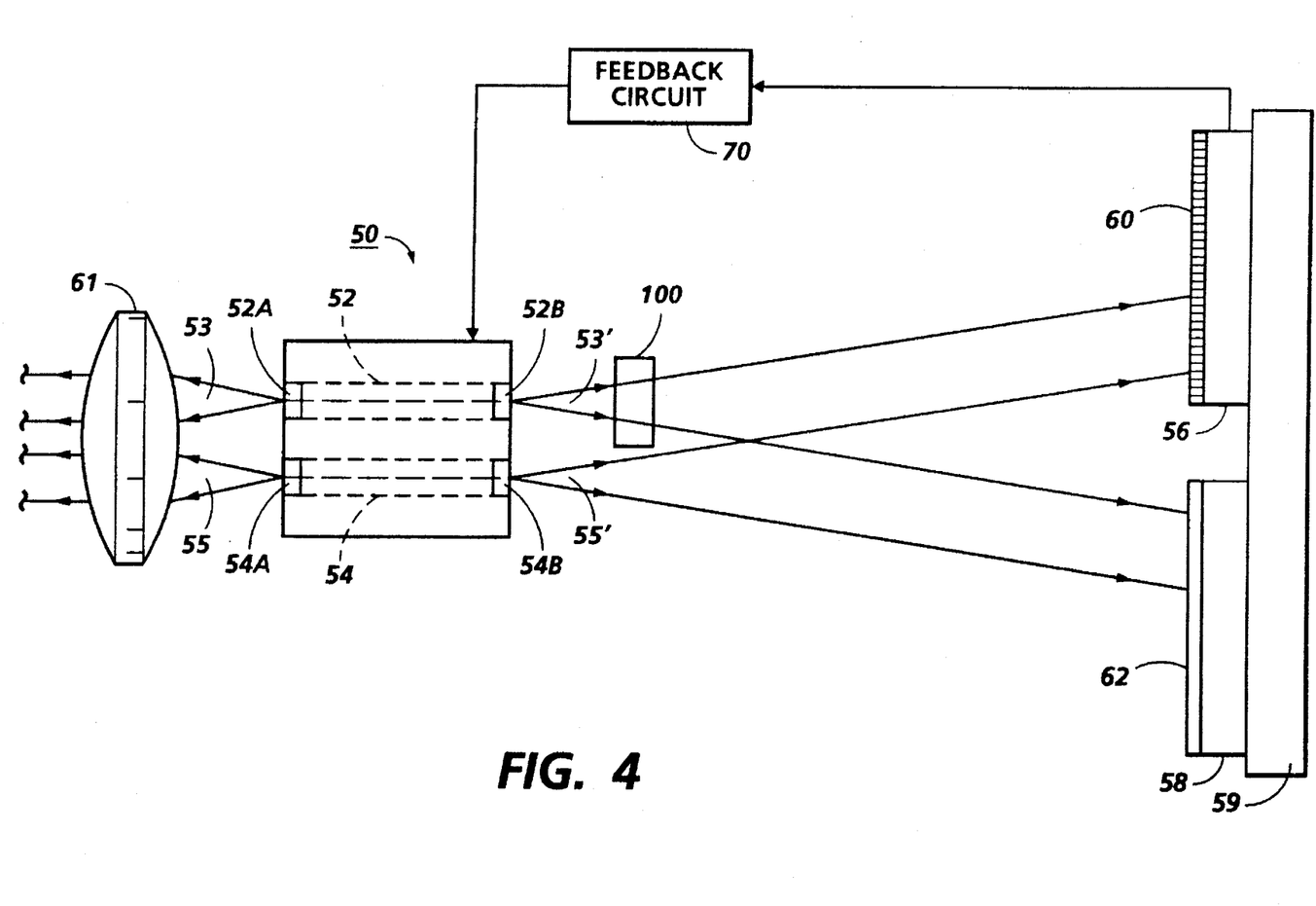
FIG. 4 is a top view of a second embodiment of the invention.

In a second embodiment shown as FIG. 4, the monolithic dual laser diode beams 53, 55 are both polarized in the plane of the page. A half wave plate 100 is positioned between laser diode 52 and photodiode 56 with its principle plane angle at 45° to the direction of polarization of the laser diodes. This half wave plate 100 must be positioned very close to laser diode 52 so that it does not intercept the beam emitted by laser diode 54. (Alternatively, a transparent substrate, not shown, could be used that has a liquid crystal half wave coating over one half of its surface.) A polarizer 60 has its axis of transmission perpendicular to the plane of the page. Polarizer 62 has its axis of transmission parallel to the plane of the page. As is well known, the direction of polarization of the beam emitted by laser diode 52 will be rotated 90° by the half wave plate, thus making it parallel to the transmission axis of the polarizer 56. This configuration prevents the beam from laser diode 52 from reaching photodiode 58, and the beam from laser diode 54 from reaching photodiode 56. The configuration will work with monolithic dual diodes, as shown, and also with hybrid dual diode pairs. It will also work with laser diode pairs which are both polarized in the direction perpendicular to the plane of the page. In this case both polarizers must be rotated by 90°. The output of photodiodes 56, 58 is sent to feedback circuit 70 which controls the output of the laser diode pair in the manner discussed previously when describing the FIG. 2 embodiment.

Figure 5:
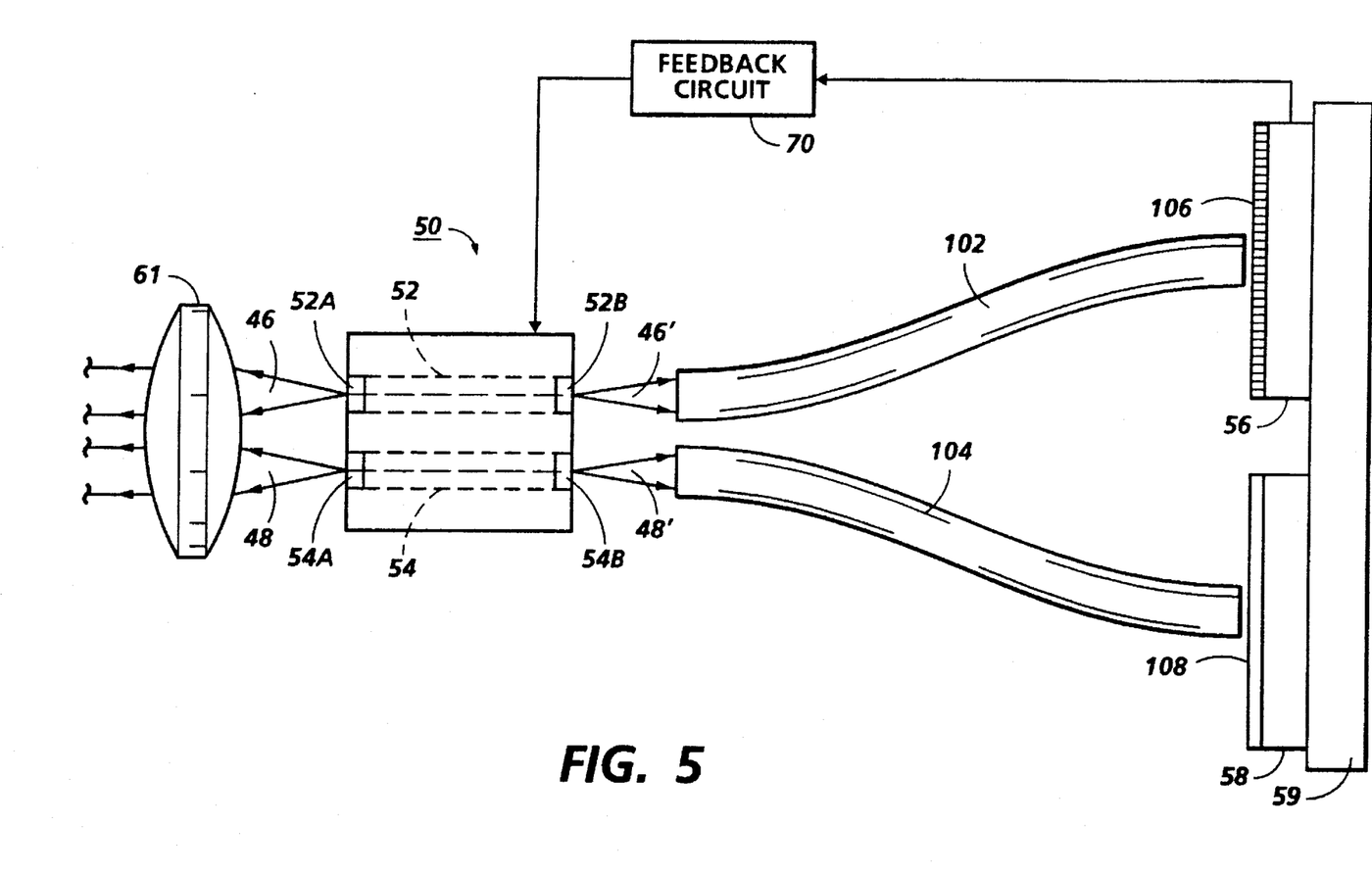
FIG. 5 is a top view of a third embodiment of the invention.

In a third embodiment of the invention, shown in FIG. 5, two optical fibers are used to transmit the back facet light from the laser diode to the photodiodes through orthogonally oriented polarizers. Referring to FIG. 5, laser diodes 52, 54 can be fabricated with output beams polarized in the plane of the page or perpendicular to the plane of the page. For the embodiment shown, laser diode 52 output is polarized in the plane of the page and laser diode 54 output is polarized perpendicular to the plane of the page. Optical fibers 102, 104 are mounted close to back facets 52B, 54B, respectively, to capture some of the light from each of the laser diodes. Polarizers 106, 108 are positioned on photodiodes 56, 58, respectively. Polarizer 106 has its axis of transmission parallel to the direction of polarization of the beams emitted from back facet 52B; polarizer 108 has its axis of transmission parallel to the direction of polarization of the beam emitted from back facet 54B. This configuration prevents the beam from back facet 52B from reaching photodiode 58 and the beam from back facet 54B from reaching photodiode 56. The outputs of photodiodes 56, 58 are sent to feedback circuit 70 which controls the operation of laser diodes 52, 54 in the manner described with referenced to the FIG. 2 embodiment.

While the embodiment disclosed herein is preferred, it will be appreciated from this teaching that various alternative, modifications, variations or improvements therein may be made by those skilled in the art, which are intended to be encompassed by the following claims:

What is claimed is:

1. A laser power control apparatus, comprising
    a first laser diode having a front facet, a back facet, and a current input for receiving a drive current, said first laser diode for emitting laser light having a first polarization at a power that depends upon the drive current;
    a second laser diode having a front facet and a back facet, said second laser diode for emitting laser light at a second polarization that is different from said first polarization;
    a first photodetector positioned to receive laser light emitted from the back facet of said first laser diode and laser light emitted from the back facet of said second laser diode, said first photodetector further for producing a first electrical signal that depends upon the laser light received by said first photodetector;
    a second photodetector positioned to receive laser light emitted from the back facet of said first laser diode and laser light emitted from the back facet of said second laser diode, said second photodetector further for producing a second electrical signal that depends upon the laser light received by said second photodetector;
    a first polarization filter disposed between said first photodetector and said back facets, said first polarization filter for passing laser light emitted from said first laser diode to said first photodetector and for attenuating laser light emitted from said second laser diode;
    a second polarization filter disposed between said second photodetector and said back facets, said second polarization filter for passing laser light emitted from said second laser diode and for attenuating laser light emitted from said first laser diode; and
    a control circuit for monitoring the first electrical signal and the second electrical signal, said control circuit further for adjusting the control current applied to said first laser diode based upon said first and second electrical signals.

2. The apparatus of claim 1 wherein said first polarization and said second polarization are substantially perpendicular.

3. The apparatus of claim 1 further including an optical fiber for transmitting the laser light emitted from said back facets to said first polarization filter and to said second polarization filter.

4. A laser power control apparatus, comprising
    a first laser diode having a front facet, a back facet, and a current input for receiving a drive current, said first laser diode for emitting laser light having a first polarization at a power that depends upon the drive current;
    a second laser diode having a front facet and a back facet, said second laser diode for emitting laser light at a second polarization that is substantially parallel to said first polarization;
    a polarization shifting device for shifting the polarization of said laser light emitted from the back facet of said first laser diode from said first polarization to a third polarization;
    a first photodetector positioned to receive laser light phase shifted by said polarization shifting device and laser light emitted from the back facet of said second laser diode, said first photodetector further for producing a first electrical signal that depends upon the laser light received by said first photodetector;
    a second photodetector positioned to receive laser light phase shifted by said polarization shifting device and laser light emitted from the back facet of said second laser diode, said second photodetector further for producing a second electrical signal that depends upon the laser light received by said second photodetector;
    a first polarization filter disposed between said first photodetector and both said phase shifting device and said back facet of said second laser diode, said first polarization filter for passing laser light at said third polarization and for attenuating laser light emitted from said second laser diode;

a second polarization filter disposed between said second photodetector and said back facets, said second polarization filter for passing laser light emitted from said second laser diode and for attenuating laser light at said third polarization; and a control circuit for monitoring the first electrical signal and the second electrical signal, said control circuit further for adjusting the control current applied to said first laser diode based upon said first and second electrical signals.

5. The apparatus of claim 4 wherein said third polarization and said second polarization are substantially perpendicular.

6. The apparatus of claim 4, wherein said polarization shifting device comprises a half wave plate.

7. The apparatus of claim 4 further including an optical fiber for transmitting the light emitted from said back facets to said second polarization filter.

8. A method of controlling the light emitted by a Raster Scanner, comprising:

radiating a first polarity of laser light that is derived from the back facet of a first laser diode toward a first photodetector and toward a second photodetector;

radiating a second polarity of laser light that is derived from the back facet of a second laser diode toward a first photodetector and toward a second photodetector, wherein the second polarity is different from the first polarity;

polarity filtering the laser light received by the first photodetector such that laser light at the first polarity is passed and such that laser light at the second polarity is attenuated;

polarity filtering the light received by the second photodetector such that laser light at the second polarity is passed and such that laser light at the first polarity is attenuated; and adjusting the laser light emitted from the first laser diode based upon the output of said first photodetector and the output of said second photodetector such that the intensity of laser light from said first laser diode is maintain at a predetermined output level.

9. The method of claim 8, further including the step of transmitting laser light from the back facet of the second laser diode toward the second photodetector using an optical fiber.

* * * * *